(12) United States Patent
Shishido

(10) Patent No.: US 12,013,631 B2
(45) Date of Patent: *Jun. 18, 2024

(54) MASK BLANK, TRANSFER MASK, AND METHOD FOR MANUFACTURING SEMICONDUCTOR DEVICE

(71) Applicant: HOYA CORPORATION, Tokyo (JP)

(72) Inventor: Hiroaki Shishido, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 35 days.

This patent is subject to a terminal disclaimer.

(21) Appl. No.: 18/073,794

(22) Filed: Dec. 2, 2022

(65) Prior Publication Data

US 2023/0099176 A1 Mar. 30, 2023

Related U.S. Application Data

(63) Continuation of application No. 17/397,642, filed on Aug. 9, 2021, now Pat. No. 11,543,744, which is a
(Continued)

(30) Foreign Application Priority Data

Aug. 26, 2016 (JP) .................. 2016-165550

(51) Int. Cl.
*G03F 1/26* (2012.01)
*G03F 1/50* (2012.01)
(Continued)

(52) U.S. Cl.
CPC .................. *G03F 1/26* (2013.01); *G03F 1/50* (2013.01); *G03F 1/54* (2013.01); *G03F 7/20* (2013.01)

(58) Field of Classification Search
CPC ..... G03F 1/26; G03F 1/54; G03F 1/50; G03F 7/20; G03F 7/70958
See application file for complete search history.

(56) References Cited

U.S. PATENT DOCUMENTS 11,112,690 B2 * 9/2021 Shishido .................... G03F 1/54
11,543,744 B2 * 1/2023 Shishido .................... G03F 1/50
(Continued)

FOREIGN PATENT DOCUMENTS

JP 2007033470 A 2/2007
JP 2010044274 A 2/2010
(Continued)

OTHER PUBLICATIONS

U.S. Appl. No. 16/327,172, "Non-Final Office Action", Dec. 24, 2020, 8 pages.
(Continued)

*Primary Examiner* — Stewart A Fraser
(74) *Attorney, Agent, or Firm* — Kilpatrick Townsend & Stockton LLP

(57) ABSTRACT

A mask blank including a light shielding film pattern having high ArF light fastness.
The light shielding film is on a transparent substrate. In the mask blank, the light shielding film is a single layer film formed of a material containing silicon and nitrogen, and the light shielding film has an optical density to an ArF excimer laser exposure light of 2.5 or more, a surface reflectance to the exposure light of 40% or less, a back-surface reflectance to the exposure light of 40% or less, a transmittance to a light having a wavelength of 900 nm of 50% or less, an extinction coefficient to a light having a wavelength of 900 nm of 0.04 or more, and a thickness of 60 nm or less.

18 Claims, 3 Drawing Sheets

Related U.S. Application Data continuation of application No. 16/327,172, filed as application No. PCT/JP2017/028043 on Aug. 2, 2017, now Pat. No. 11,112,690.

(51) Int. Cl.
*G03F 1/54* (2012.01)
*G03F 7/20* (2006.01)

(56) References Cited

U.S. PATENT DOCUMENTS

| | | |
|---|---|---|
| 2004/0063001 A1 | 4/2004 | Wu et al. |
| 2007/0020534 A1 | 1/2007 | Yoshikawa et al. |
| 2010/0248090 A1 | 9/2010 | Inazuki et al. |
| 2011/0305978 A1 | 12/2011 | Iwashita et al. |
| 2017/0139316 A1 | 5/2017 | Shishido et al. |
| 2017/0168384 A1 | 6/2017 | Shishido et al. |
| 2017/0255095 A1* | 9/2017 | Kosaka ............... H01L 21/0273 |

FOREIGN PATENT DOCUMENTS

| | | |
|---|---|---|
| JP | 2010237499 A | 10/2010 |
| JP | 2013178372 A | 9/2013 |
| JP | 2015191218 A | 11/2015 |
| JP | 2015200883 A | 11/2015 |
| JP | 2016212322 A | 12/2016 |
| KR | 20110002053 A | 1/2011 |

OTHER PUBLICATIONS

U.S. Appl. No. 16/327,172, "Notice of Allowance", Jun. 9, 2021, 8 pages.
U.S. Appl. No. 17/397,642, "Non-Final Office Action", Sep. 16, 2022, 8 pages.
U.S. Appl. No. 17/397,642, "Notice of Allowance Received", Nov. 1, 2022, 8 pages.
KR10-2019-7002746, "Office Action", Jun. 4, 2020, 20 pages.
PCT/JP2017/028043, "International Search Report and Written Opinion", Oct. 24, 2017, 15 pages.

* cited by examiner

[FIG. 1]
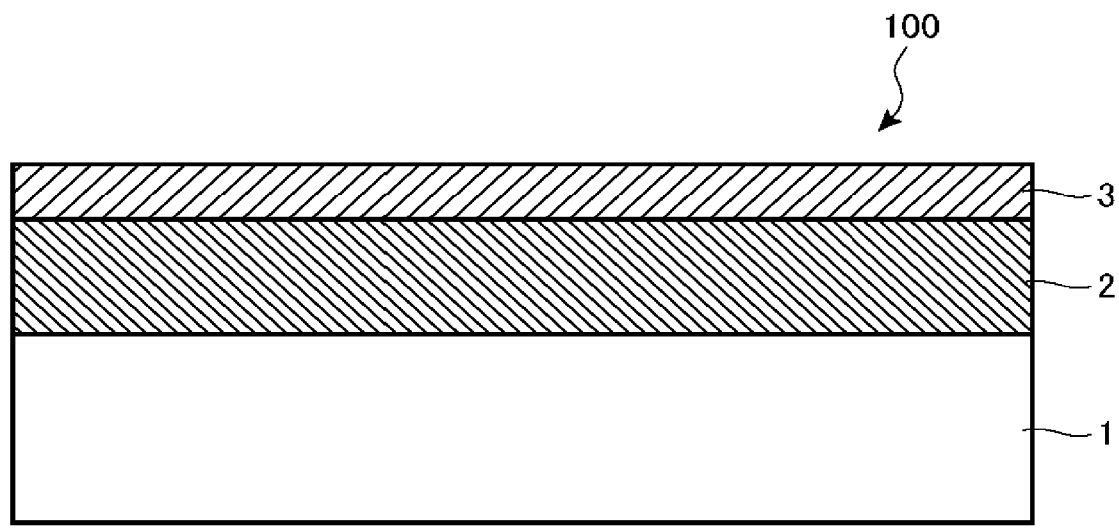
[FIG. 2]
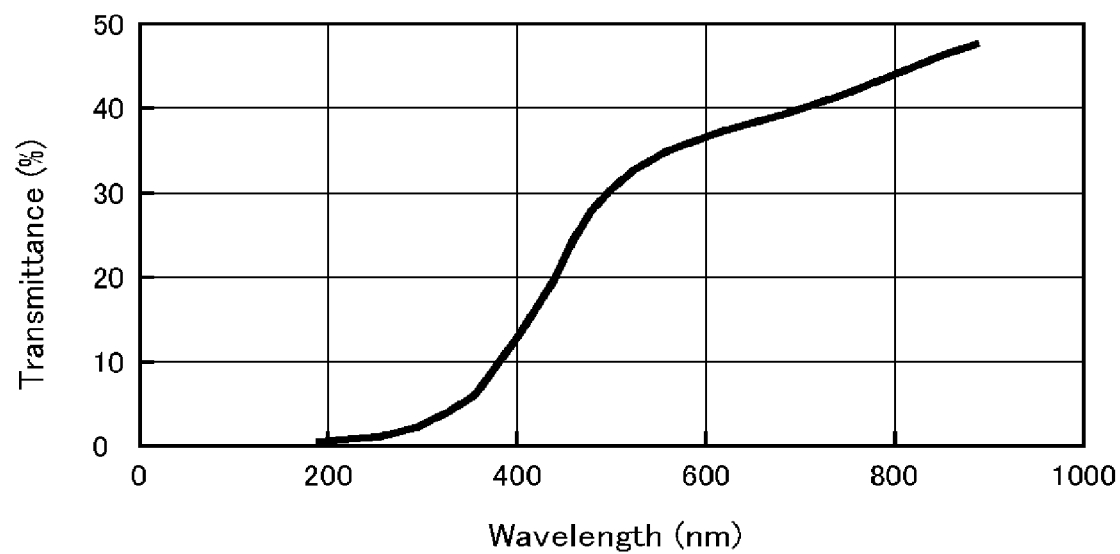

[FIG. 3]
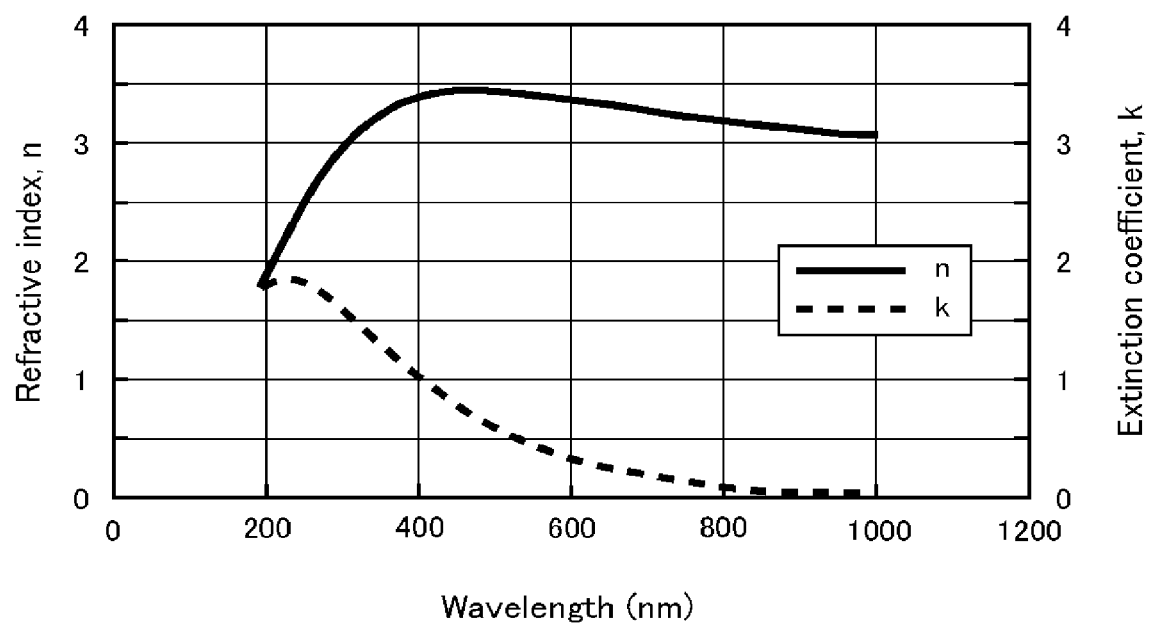

MASK BLANK, TRANSFER MASK, AND METHOD FOR MANUFACTURING SEMICONDUCTOR DEVICE

CROSS REFERENCE TO RELATED APPLICATIONS

This application is a continuation of U.S. application Ser. No. 17/397,642, filed Aug. 9, 2021, which is a continuation of U.S. application Ser. No. 16/327,172, filed Feb. 21, 2019, which is the U.S. National Stage of International Application No. PCT/JP2017/028043, filed Aug. 2, 2017, which claims priority to Japanese Patent Application No. 2016-165550, filed Aug. 26, 2016, the entire contents of which are hereby incorporated by reference in their entirety.

TECHNICAL FIELD

The present disclosure relates to a mask blank and a transfer mask manufactured using the mask blank. Additionally, the present disclosure relates to a method of manufacturing a semiconductor device using the transfer mask.

BACKGROUND ART

At steps in manufacturing a semiconductor device, a photolithography method is used to form a fine pattern. To make a semiconductor device pattern finer, it is necessary not only to make a mask pattern formed on a transfer mask finer, but also to shorten a wavelength of an exposure light source used in photolithography. In recent years, an ArF excimer laser (wavelength: 193 nm) has been applied increasingly to an exposure light source used in manufacturing a semiconductor device.

The transfer mask includes a binary mask. For example, the binary mask is a transfer mask including a light shielding film pattern configured to shield exposure light and formed on a transparent substrate, as described in Patent Literature 1. As the light shielding film, a chromium (Cr)-based or molybdenum silicide (MoSi)-based material has been widely used.

When a light shielding film includes a chromium-based material, a mixed gas of chlorine-based gas and oxygen gas is used in dry etching. This mixed gas is highly radical, and thus it has been difficult to dry etch the light shielding film with sufficient anisotropy, and it has been difficult to form a fine light shielding film pattern with sufficient precision.

When a molybdenum silicide (MoSi)-based material is used as a material for the light shielding film, the aforementioned problem with dry etching is less likely to occur, and it is easy to form a fine light shielding film pattern with high precision. On the other hand, an MoSi-based film has been recently found to have low fastness to exposure light of an ArF excimer laser (ArF exposure light) (that is, ArF light fastness).

CITATION LIST

Patent Literature

Patent Literature 1: JP 2007-33470 A

SUMMARY OF DISCLOSURE

Technical Problem

When a material containing silicon and nitrogen is used as a phase shift film, it is confirmed to achieve high ArF light fastness. Thus, the inventors have found a possibility that a thin film (SiNx film) made of the material containing silicon and nitrogen can be applied as a light shielding film of a binary mask to obtain high ArF light fastness, and the inventors have studied the light shielding film. However, when the light shielding film is formed using an SiNx film with a single layer structure, the following problem has been found.

In a binary mask, a light shielding film formed a transfer pattern is typically required to have an optical density of equal to or more than a predetermined value (e.g., 2.5 or more) to an ArF excimer laser exposure light (hereinafter referred to as ArF exposure light) with which an exposure apparatus irradiates. Further, the light shielding film is required to have a reflectance of equal to or less than a predetermined value for ArF exposure light entering a surface on a side being in contact with a transparent substrate (back-surface reflectance, for example, 40% or less), and at the same time, is required to have a reflectance of equal to or less than a predetermined value to ArF exposure light entering a surface on a side opposite to a transparent substrate side (surface reflectance, for example, 40% or less). From the viewpoint of an optical density required for the light shielding film, the SiNx film preferably contains a smaller amount of nitrogen. However, from the viewpoint of a surface reflectance and a back-surface reflectance required for the light shielding film, the SiNx film needs to contain a certain amount of nitrogen.

Depending on an exposure apparatus, an operation involving exposure may be performed after alignment mark detection using long-wavelength light having a wavelength of 800 nm or more and 900 nm or less. Here, this long-wavelength light is referred to as long-wavelength detection light LW. When a binary mask including, as a light shielding film, an SiNx film with a single layer structure is placed in an exposure apparatus using the long-wavelength detection light LW to perform exposure, a problem of an exposure operation that cannot be performed owing to insufficient detection sensitivity in alignment mark detection has often occurred.

When the nitrogen content of the SiNx film constituting the light shielding film is largely decreased, a transmittance of the long-wavelength light can be decreased, and the problem of insufficient detection sensitivity in alignment mark detection is solved. However, since both a surface reflectance and a back-surface reflectance to ArF exposure light of such a light shielding film increase, another problem of a large decrease in transfer performance as the binary mask occurs.

An object of the present disclosure is to provide a mask blank including a light shielding film including an SiNx film with a single layer structure, and the mask blank satisfies various optical properties for ArF exposure light required for a light shielding film, and also solves a problem of insufficient sensitivity during mark detection performed using long-wavelength light having a wavelength of 800 nm or more and 900 nm or less. Additionally, another object of the prevent disclosure is to provide a transfer mask manufactured using such a mask blank. Further, still another object of the present disclosure is to provide a method of manufacturing a semiconductor device using such a transfer mask.

Solution to Problem

To solve the aforementioned problems, the present disclosure includes the following configurations.

Configuration 1

A mask blank including a light shielding film on a transparent substrate, wherein the light shielding film is a single layer film formed of a material containing silicon and nitrogen, and the light shielding film has an optical density to an ArF excimer laser exposure light of 2.5 or more, a surface reflectance to the exposure light of 40% or less, a back-surface reflectance to the exposure light of 40% or less, a transmittance to a light having a wavelength of 900 nm of 50% or less, an extinction coefficient k to a light having a wavelength of 900 nm of 0.04 or more, and a thickness of 60 nm or less.

Configuration 2

The mask blank according to configuration 1, wherein the light shielding film is formed of a material consisting of silicon and nitrogen, or a material consisting of silicon, nitrogen, and one or more elements selected from a semimetal element and a non-metal element.

Configuration 3

The mask blank according to configuration 1 or 2, wherein the light shielding film includes at its surface layer a composition gradient portion with increased oxygen content toward a surface opposite to the transparent substrate, and the light shielding film except for the surface layer is formed of a material consisting of silicon and nitrogen, or a material consisting of silicon, nitrogen, and one or more elements selected from a semimetal element and a non-metal element.

Configuration 4

The mask blank according to any one of configurations 1 to 3, including on the light shielding film a hard mask film made of a material containing chromium.

Configuration 5

A transfer mask including on a transparent substrate a light shielding film including a transfer pattern, wherein the light shielding film is a single layer film formed of a material containing silicon and nitrogen, and the light shielding film has an optical density to an ArF excimer laser exposure light of 2.5 or more, a surface reflectance to the exposure light of 40% or less, a back-surface reflectance to the exposure light of 40% or less, a transmittance to a light having a wavelength of 900 nm of 50% or less, an extinction coefficient k to a light having a wavelength of 900 nm of 0.04 or more, and a thickness of 60 nm or less.

Configuration 6

The transfer mask according to configuration 5, wherein the light shielding film is formed of a material consisting of silicon and nitrogen, or a material consisting of silicon, nitrogen, and one or more elements selected from a semimetal element and a non-metal element.

Configuration 7

The transfer mask according to configuration 5 or 6, wherein the light shielding film includes at its a surface layer a composition gradient portion with increased oxygen content toward a surface opposite to the transparent substrate, and the light shielding film except for the surface layer is formed of a material consisting of silicon and nitrogen, or a material consisting of silicon, nitrogen, and one or more elements selected from a semimetal element and a non-metal element.

Configuration 8

A method of manufacturing a semiconductor device, the method including the step of exposure-transferring a transfer pattern on a resist film on a semiconductor substrate using the transfer mask according to any one of configurations 5 to 7.

Advantageous Effects of Disclosure

A light shielding film of a mask blank of the present disclosure is formed of a material containing silicon and nitrogen, and has a transmittance to a light having a wavelength of 900 nm of 50% or less and an extinction coefficient k to a light having a wavelength of 900 nm of 0.04 or more. The material containing silicon and nitrogen has high ArF light fastness. Additionally, the material containing silicon and nitrogen has properties in which the transmittance becomes higher and the extinction coefficient k becomes smaller to a light having a wavelength of 800 nm or more and 900 nm or less as the wavelength of the light becomes longer. Owing to these optical properties, when a transmittance to a light having a wavelength of 900 nm is 50% or less and an extinction coefficient to a light having a wavelength of 900 nm is 0.04 or more, long-wavelength detection light LW can be decreased sufficiently. Therefore, the long-wavelength detection light LW can be used to detect with sufficient contrast an alignment mark formed on a transfer mask manufactured using this mask blank, and a problem of exposure that cannot be performed owing to insufficient detection sensitivity in alignment mark detection can be solved.

Additionally, the light shielding film of the mask blank of the present disclosure has an optical density to an ArF excimer laser exposure light of 2.5 or more, a surface reflectance to the exposure light of 40% or less, and a back-surface reflectance to the exposure light of 40% or less. Thus, the light shielding film has an optically sufficient transfer property by exposure for pattern exposure light.

Further, the light shielding film has a film thickness of 60 nm or less, and thus a bias (EMF bias) involved in an electromagnetic field effect of a mask pattern and a shadowing effect caused by a mask pattern stereo structure can fall within the allowable range. Additionally, the light shielding film is a thin film, and thus it is easy to form a fine light shielding film pattern.

Additionally, the light shielding film is a single layer, and thus the number of steps in manufacturing the light shielding film is small, and control of manufacturing quality including a defect is facilitated.

Additionally, in the transfer mask of the present disclosure, a light shielding film including a transfer pattern has the same properties as the properties of the light shielding film of the mask blank of the present disclosure. In such a transfer mask, the light shielding film including a transfer pattern has high ArF light fastness, and additionally, a problem of exposure that cannot be performed owing to insufficient detection sensitivity in alignment mark detection can be solved.

BRIEF DESCRIPTION OF DRAWINGS

FIG. 1 is a cross-sectional view illustrating a configuration of a mask blank according to an embodiment of the present disclosure.

FIG. 2 is a graph of properties showing wavelength dependence of a transmittance of a light shielding film according to the embodiment of the present disclosure.

FIG. 3 is a graph of properties showing wavelength dependence of an optical coefficient of the light shielding film according to the embodiment of the present disclosure.

DESCRIPTION OF EMBODIMENTS

Figure 4A:
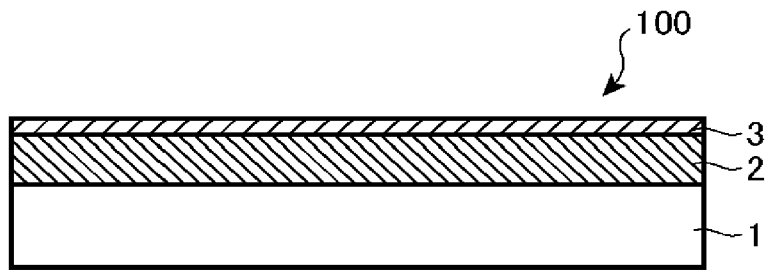
FIG. 4A to 4F are cross-sectional views illustrating steps in manufacturing a transfer mask according to an embodiment of the present disclosure.
Figure 4B:
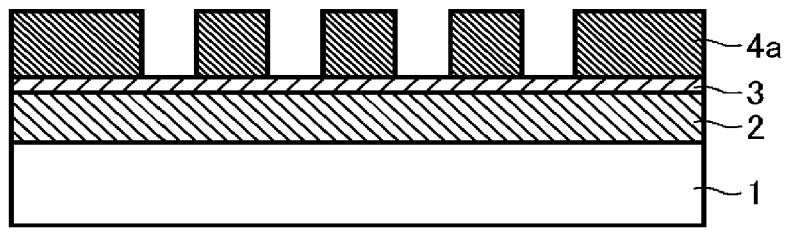

First, the circumstances leading to the completion of the present disclosure will be described. The present inventors have intensively studied a cause of insufficient detection sensitivity in alignment mark detection using long-wavelength detection light LW. As a result, the inventors have found that insufficient detection sensitivity in alignment mark detection is due to insufficient optical contrast, and this insufficient optical contrast is caused by a light shielding film incapable of sufficiently decreasing the long-wavelength detection light.

Then, the inventors have studied a light shielding film capable of sufficiently decreasing the long-wavelength detection light LW. In the study, the inventors have taken into consideration that the light shielding film can be applied even when a wavelength of the long-wavelength detection light LW varies depending on an exposure apparatus.

When the wavelength of a light is 800 nm or more and 900 nm or less, a material having high ArF light fastness and containing silicon and nitrogen has a higher transmittance as the wavelength of the light becomes longer. In other words, the material has spectral properties in which as the wavelength is longer, an extinction coefficient k is smaller. Then, a transmittance of the light shielding film at a wavelength of 900 nm is specified to impart a property of sufficiently decreasing the long-wavelength detection light LW to the light shielding film. In view of such circumstances, the inventors have considered that a light shielding film can be formed of a material containing silicon and nitrogen and a transmittance of the light shielding film at a wavelength of 900 nm can be specified to secure high ArF light fastness and also to solve the problem of alignment mark detection failure.

Additionally, an optical density to ArF exposure light of the light shielding film, a reflectance of each of a surface and a back-surface of the light shielding film to the exposure light, and a film thickness of the light shielding film are specified to enable transfer of a fine pattern.

The inventors have further investigated the light shielding film, and as a result, found that a single layer film facilitating control of quality including a defect and control of manufacturing steps with the decreased number of steps can be used to obtain a film satisfying the aforementioned specifications. As a result, the present disclosure has been completed.

Mask Blank

Next, each embodiment of the present disclosure will be described. FIG. 1 is a cross-sectional view illustrating a configuration of a mask blank 100 according to an embodiment of the present disclosure. The mask blank 100 illustrated in FIG. 1 includes a structure where a light shielding film 2 and a hard mask film 3 are layered in this order on a transparent substrate 1.

Transparent Substrate

The transparent substrate 1 can be formed of synthetic quartz glass, quartz glass, aluminosilicate glass, soda-lime glass, low thermal expansion glass ($SiO_2$—$TiO_2$ glass, or the like), or the like. Among these, synthetic quartz glass has a high transmittance to ArF exposure light (wavelength: 193 nm) and is particularly preferable as a material forming a transparent substrate of a mask blank.

Light Shielding Film

The light shielding film 2 is a single layer film formed of a material containing silicon and nitrogen, and preferably a single layer film formed of a material consisting of silicon and nitrogen or a material consisting of silicon, nitrogen, and one or more elements selected from a semimetal element and a non-metal element.

The light shielding film 2 contains no transition metal that can become a factor of decreasing light fastness to ArF exposure light. Additionally, since there is no ruling out a possibility that the metal element might become a factor of decreasing light fastness to the ArF exposure light, it is desirable that the light shielding film 2 contain no metal element other than a transition metal.

The light shielding film 2 may contain any semimetal element in addition to silicon. Among the semimetal elements, the light shielding film 2 preferably contains one or more elements selected from boron, germanium, antimony, and tellurium, and in this case, an increase in conductivity of silicon used as a sputtering target can be expected.

The light shielding film 2 may contain any non-metal element in addition to nitrogen. Here, the non-metal element in the present disclosure includes a narrowly-defined non-metal element (nitrogen, carbon, oxygen, phosphorus, sulfur, and selenium), halogen, and the noble gas. Among the non-metal elements, the light shielding film 2 preferably contains one or more elements selected from carbon, fluorine, and hydrogen. The oxygen content of the light shielding film 2 except for a region of a surface layer described below is preferably 5 atom % or less, and more preferably 3 atom % or less. It is further preferable that the light shielding film 2 except for the region of the surface layer do not positively contain oxygen (at a detection lower limit value or less as measured by composition analysis using X-ray Photoelectron Spectroscopy (XPS)) or the like. This is because when a film made of a silicon nitride-based material contains oxygen, a value of the extinction coefficient k becomes small, and a sufficient light shielding property is less likely to be obtained.

For the transparent substrate 1, a material containing $SiO_2$ such as synthetic quartz glass as a main component is preferably used. When the light shielding film 2 contains oxygen, the difference between composition of the light shielding film 2 and composition of the transparent substrate 1 becomes small, and there also occurs a problem of etching selectivity for the transparent substrate 1 that becomes less likely to be obtained in dry etching with fluorine-based gas performed in formation of a pattern on the light shielding film 2.

The light shielding film 2 may contain a noble gas. The noble gas is an element existing in a film forming chamber when a thin film is formed by reactive sputtering and accordingly being capable of increasing a deposition rate to improve productivity. The noble gas becomes plasma and collides with a target. As a result, a target constituent particle is emitted from the target. While the target constituent particle is emitted from the target, the target constituent particle incorporates a reactive gas, and is layered on the transparent substrate 1 to form the thin layer. The noble gas in the film forming chamber is slightly incorporated until the target constituent particle is adhered to the transparent substrate 1 after the target constituent particle is emitted from the target. Preferable examples of the noble gas necessary for the reactive sputtering include argon, krypton, and xenon. Additionally, to relax a stress of the thin film, helium and neon having a small atomic weight can be incorporated positively in the thin film.

The nitrogen content of the light shielding film 2 is preferably 50 atom % or less, and more preferably 45 atom % or less. This is because when the nitrogen content is more than 50 atom %, the extinction coefficients to ArF exposure light and for the long-wavelength detection light LW become small, and it becomes difficult to sufficiently shield light and decrease light. Additionally, the nitrogen content of the light shielding film 2 is preferably 25 atom % or more, and more preferably 30 atom % or more. This is because when the nitrogen content is less than 25 atom %, cleaning durability is likely to become insufficient, and additionally, oxidation is likely to occur, and stability over time of a film is likely to be impaired.

Additionally, the silicon content of the light shielding film 2 is preferably 50 atom % or more, and more preferably 55 atom % or more. This is because when the silicon content is less than 50 atom %, the extinction coefficients to ArF exposure light and for the long-wavelength detection light LW become small, and it becomes difficult to sufficiently shield light and decrease light. Additionally, the silicon content of the light shielding film 2 is preferably 75 atom % or less, and more preferably 65 atom % or less. This is because when the silicon content is more than 75 atom %, cleaning durability is likely to become insufficient, and additionally, oxidation is likely to occur, and stability over time of the film is likely to be impaired.

The light shielding film 2 is preferably formed of the material containing silicon and nitrogen. Note that the noble gas is an element difficult to detect even by performing composition analysis such as Rutherford Back-scattering Spectrometry (RBS) and XPS of the thin film. However, as described above, when the light shielding film 2 is formed by reactive sputtering, the noble gas is slightly incorporated. Therefore, the aforementioned material containing silicon and nitrogen can be considered to include a material containing the noble gas.

The light shielding film 2 is required to have a thickness of 60 nm or less. When the light shielding film 2 has a thickness of 60 nm or less, a bias (EMF bias) involved in an electromagnetic field effect of a mask pattern and a shadowing effect caused by a mask pattern stereo structure can fall within the allowable range. Additionally, the light shielding film 2 is relatively thin, and thus it becomes easy to form a fine light shielding film pattern. The thickness of the light shielding film 2 is more preferably 58 nm or less.

On the other hand, the thickness of the light shielding film 2 is preferably 40 nm or more, and more preferably 45 nm or more. When the thickness of the light shielding film 2 is less than 40 nm, it becomes difficult to secure the following optical density to ArF exposure light, and it also becomes difficult to obtain a property of sufficiently decreasing the long-wavelength detection light LW.

The light shielding film 2 is required to have an optical density (OD value) to ArF exposure light of 2.5 or more, and preferably 2.8 or more. When the optical density is less than 2.5, the property of shielding ArF exposure light becomes insufficient, and when exposure is performed using a transfer mask using this mask blank, there occurs a problem of contrast of a projected optical image (transfer image) of the transfer mask that is likely to be insufficient. On the other hand, to make the light shielding film 2 thinner, the optical density of the light shielding film 2 is preferably 4.0 or less.

The light shielding film 2 is required to have a surface reflectance (reflectance of a surface on a side opposite to the transparent substrate 1 side) to ArF exposure light of 40% or less, and preferably 38% or less. When the surface reflectance to ArF exposure light is higher than 40%, there occurs a problem of reflection of exposure light that becomes too large, and leads to deterioration of a projected optical image during transfer by exposure.

Additionally, the light shielding film 2 preferably has the surface reflectance to ArF exposure light of 20% or more. This is because when the surface reflectance to ArF exposure light is less than 20%, pattern inspection sensitivity during mask pattern inspection using light having a wavelength of 193 nm or about 193 nm decreases.

The light shielding film 2 is required to have a back-surface reflectance (reflectance of a surface on the transparent substrate 1 side) to ArF exposure light of 40% or less, and preferably 35% or less. When the back-surface reflectance to ArF exposure light is more than 40%, there occurs a problem of reflection of exposure light that becomes too large, and leads to deterioration of a projected optical image during transfer by exposure.

To make the optical density, the surface reflectance, and the back-surface reflectance to ArF exposure light of the light shielding film 2 within the aforementioned ranges, the light shielding film 2 has a refractive index n to ArF exposure light of preferably 1.6 or more and 2.1 or less, and more preferably 1.7 or more and 2.0 or less. Additionally, an extinction coefficient k to ArF exposure light is preferably 1.6 or more and 2.1 or less, and more preferably 1.7 or more and 2.0 or less.

The light shielding film 2 is required to have a transmittance to a light having a wavelength of 900 nm of 50% or less, and preferably 48% or less. The light shielding film 2 is required to have an extinction coefficient k to a light having a wavelength of 900 nm of 0.04 or more, and preferably 0.045 or more. Additionally, the extinction coefficient k to a light having a wavelength of 900 nm of the light shielding film 2 is preferably 0.1 or less. The light shielding film 2 has a refractive index n to a light having a wavelength of 900 nm of preferably 2.5 or more, and more preferably 2.7 or more. Additionally, the refractive index n to a light having a wavelength of 900 nm of the light shielding film 2 is preferably 3.5 or less.

When the wavelength of a light is 800 nm or more and 900 nm or less, the light shielding film 2 including the material containing silicon and nitrogen has properties in which the transmittance becomes higher and both the refractive index n and the extinction coefficient k become smaller as the wavelength of the light becomes longer, as described above. Owing to these spectral properties, when a transmittance to a light having a wavelength of 900 nm is 50% or less and an extinction coefficient k to a light having a wavelength of 900 nm is 0.04 or more, the long-wavelength detection light LW having a wavelength in the range of 800 nm or more and 900 nm or less can be decreased sufficiently by the light shielding film 2. Thus, the long-wavelength detection light LW can be used to detect with sufficient contrast an alignment mark formed on a transfer mask manufactured using this mask blank. Accordingly, the problem of exposure that cannot be performed owing to insufficient detection sensitivity in alignment mark detection can be solved.

On the other hand, the light shielding film 2 has a transmittance to a light having a wavelength of 700 nm of preferably 45% or less, and more preferably 40% or less. The light shielding film 2 has an extinction coefficient k to a light having a wavelength of 700 nm of preferably 0.10 or more, and more preferably 0.15 or more. Additionally, the extinction coefficient k to a light having a wavelength of 700 nm of the light shielding film 2 is preferably 0.5 or less. Additionally, the light shielding film 2 has a refractive index n to a light having a wavelength of 700 nm of preferably 2.8 or more, and more preferably 3.0 or more. Additionally, the refractive index n to a light having a wavelength of 700 nm of the light shielding film 2 is preferably 3.8 or less.

Depending on the exposure apparatus, an identification mark such as a bar code formed on a transfer mask is read out using detection light having a wavelength of less than 800 nm (e.g., a wavelength in the range from 600 nm to 700 nm). In a transfer mask manufactured using a mask blank including the light shielding film 2 having the aforementioned optical properties to a light having a wavelength of 700 nm, an identification code can be read out reliably using the aforementioned detection light having a wavelength of less than 800 nm.

The refractive index n and the extinction coefficient k of a thin film are not determined by composition of the thin film alone. The film density, crystal state and the like of the thin film are also elements influencing the refractive index n and the extinction coefficient k. Therefore, conditions under which the light shielding film 2 is formed by reactive sputtering are adjusted to form the light shielding film 2 having a desired refractive index n and a desired extinction coefficient k to make the optical density (OD value), the back-surface reflectance, and the surface reflectance to ArF exposure light, and the extinction coefficient k to a light having a wavelength of 900 nm fall within the specified values. A way to make the refractive index n and the extinction coefficient k of the light shielding film 2 fall within the aforementioned specified range is not limited to adjustment of the ratio of the noble gas and the reactive gas in a mixed gas used in film formation performed by reactive sputtering. There are various ways to make the refractive index n and the extinction coefficient k of the light shielding film 2 fall within the aforementioned specified range, including adjustment of a pressure within the film forming chamber in film formation performed by reactive sputtering, adjustment of electric power applied to a target, and adjustment of the positional relationship such as the distance between the target and the transparent substrate. Additionally, these film forming conditions are specific to the film forming device and are adjusted appropriately to form the light shielding film 2 having a desired refractive index n and a desired extinction coefficient k.

The light shielding film 2 is a single layer film in which the composition of a layer is even in a thickness direction of the layer or gradient in a thickness direction of the layer, except for a surface layer undergoing natural oxidation. The light shielding film 2 is a single layer film and thus, the number of steps in manufacturing decreases, production efficiency increases, and control of manufacturing quality including defects is facilitated.

A film not positively containing oxygen and containing silicon and nitrogen has high light fastness to ArF exposure light, but tends to have lower chemical resistance than a film positively containing oxygen, and containing silicon and nitrogen. Additionally, in the case of the mask blank 100 using the light shielding film 2 not positively containing oxygen as the surface layer on the side opposite to the transparent substrate 1 side of the light shielding film 2, it is difficult to avoid oxidation of the surface layer of the light shielding film 2 by washing a transfer mask 200 produced from the mask blank 100 or storing the transfer mask 200 in air. When the surface layer of the light shielding film 2 undergoes oxidation, there occurs a problem of variation in the surface reflectance to ArF exposure light of the light shielding film 2, and variation in the transfer property by exposure of the transfer mask 200.

Thus, it is preferable that the surface layer on the side opposite to the transparent substrate 1 side of the light shielding film 2 positively contain oxygen. However, when all the light shielding film 2 contains oxygen, there occurs a problem of decrease in a property of shielding ArF exposure light and a property of decreasing the long-wavelength detection light LW, as described above.

Therefore, it is desirable that the light shielding film 2 include on the surface layer a composition gradient portion with increased oxygen content toward a surface opposite to the transparent substrate 1, and a portion except for the surface layer in the light shielding film 2 (a bulk portion of the light shielding film 2) be formed of the material containing silicon and nitrogen. Here, the material containing silicon and nitrogen constituting the bulk portion of the light shielding film 2 refers to a material consisting of silicon and nitrogen or a material consisting of silicon, nitrogen, and one or more elements selected from a semimetal element and a non-metal element. Note that in this case, any of the refractive index n and the extinction coefficient k for the ArF exposure light of the light shielding film 2 is a value of all the light shielding film 2 including the surface layer, and the extinction coefficient k to a light having a wavelength of 900 nm is also a value of all the light shielding film 2 including the surface layer.

The light shielding film 2 is formed by sputtering, and any type of sputtering such as DC sputtering, RF sputtering, and ion beam sputtering is applicable. When a target having low conductivity (such as a silicon target, a silicon compound target containing no semimetal element or a little amount of a semimetal element, and the like) is used, RF sputtering or ion beam sputtering is preferably applied, and RF sputtering is more preferably applied from the viewpoint of a film forming rate.

A method of manufacturing the mask blank 100 is preferably a method including forming the light shielding film 2 on the transparent substrate 1 by reactive sputtering in a sputtering gas containing nitrogen-based gas and the noble gas with use of a silicon target or a target made of a material containing silicon and one or more elements selected from a semimetal element and a non-metal element.

As the nitrogen-based gas used in the step of forming the light shielding film, any gas is applicable as long as the gas is a gas containing nitrogen. As described above, the light shielding film 2 except for the surface layer preferably has a low oxygen content. Therefore, nitrogen-based gas containing no oxygen is preferably applied, and nitrogen gas ($N_2$ gas) is more preferably applied. Additionally, as the noble gas used in the step of forming the light shielding film 2, any noble gas is applicable. Preferable examples of the noble gas include argon, krypton, and xenon. Additionally, to relax a stress of a thin film, helium and neon having a small atomic weight can be incorporated positively in the thin film.

Examples of a method of forming the light shielding film 2 including the composition gradient portion with increased oxygen content toward the surface opposite to the transparent substrate 1 include a method including gradually adding an oxygen gas as an atmospheric gas in a final stage of forming the light shielding film 2 by sputtering, and a method in which after the light shielding film 2 is formed by sputtering, post treatment such as heating treatment in a gas containing oxygen such as air, light irradiation treatment using a flash lamp or the like in a gas containing oxygen such as air, and treatment of bringing a surface of the light shielding film into contact with ozone or oxygen plasma are added.

On the other hand, when it is preferable that the surface reflectance to ArF exposure light of the light shielding film be made lower (e.g., 30% or less), the light shielding film with the aforementioned single layer structure needs to contain a larger amount of nitrogen to achieve such a surface reflectance. In this case, an optical density per unit film thickness of the light shielding film decreases, and to secure predetermined light shielding performance, it is necessary to increase a film thickness of the light shielding film. In the case where such a low surface reflectance is required, it is preferable that the light shielding film include a layered structure including a lower layer and an upper layer from the transparent substrate side, the lower layer be formed of a material for the light shielding film with a single layer structure in the aforementioned embodiment, and the upper layer be formed of a material containing silicon and oxygen.

That is, a mask blank in another mode includes a light shielding film on a transparent substrate. The light shielding film includes a structure in which a lower layer and an upper layer are layered one on another in order from the transparent substrate side. The lower layer is formed of a material containing silicon and nitrogen, and the upper layer is formed of a material containing silicon and oxygen. The light shielding film has an optical density to ArF exposure light of 2.5 or more, a surface reflectance to ArF exposure light of 30% or less, a back-surface reflectance to ArF exposure light of 40% or less, and a transmittance to a light having a wavelength of 900 nm of 50% or less. The upper layer of the light shielding film has an extinction coefficient k of 0.04 or more to a light having a wavelength of 900 nm. The light shielding film has a thickness of 60 nm or less.

Additionally, in this mask blank in another mode, it is preferable that the lower layer of the light shielding film be formed of a material consisting of silicon and nitrogen, or a material consisting of silicon, nitrogen, and one or more elements selected from a semimetal element and a non-metal element. Further, in this mask blank in another mode, it is preferable that the upper layer of the light shielding film be formed of a material consisting of silicon and oxygen, or a material consisting of silicon, nitrogen, and one or more elements selected from a semimetal element and a non-metal element. Specifically, the lower layer of the light shielding film includes the same configuration as the configuration of the light shielding film with a single layer structure in the aforementioned embodiment.

The upper layer has an extinction coefficient k to a light having a wavelength of 800 nm or more and 900 nm or less of approximately 0, and the upper layer can hardly contribute to shielding of light having such a wavelength. Therefore, it is preferable that light shielding performance to a light having a wavelength of 800 nm or more and 900 nm or less be secured by the lower layer of the light shielding film alone. Additionally, the upper layer is required to have a function to reduce the surface reflectance, and thus the upper layer has low light shielding performance to ArF exposure light. Therefore, it is preferable that a predetermined optical density to ArF exposure light be secured by the lower layer of the light shielding film alone.

A transfer mask in another mode includes a light shielding film including a transfer pattern on a transparent substrate. The light shielding film includes a structure in which a lower layer and an upper layer are layered one on another in order from the transparent substrate side. The lower layer is formed of a material containing silicon and nitrogen, and the upper layer is formed of a material containing silicon and oxygen. The light shielding film has an optical density to ArF exposure light of 2.5 or more, a surface reflectance to ArF exposure light of 30% or less, a back-surface reflectance to ArF exposure light of 40% or less, and a transmittance to a light having a wavelength of 900 nm of 50% or less. The lower layer of the light shielding film has an extinction coefficient k to a light having a wavelength of 900 nm of 0.04 or more. The light shielding film has a thickness of 60 nm or less. Note that other matters (matters relating to the transparent substrate and a hard mask film, and the like) according to the mask blank and the transfer mask in another mode are the same as those of the mask blank and the transfer mask in the aforementioned embodiment.

Hard Mask Film

In the mask blank 100 including the light shielding film 2, it is preferable that a hard mask film 3 formed of a material having etching selectivity to an etching gas used in etching the light shielding film 2 be further layered on the light shielding film 2. Since the light shielding film 2 needs to ensure a predetermined optical density, the light shielding film 2 has a lower limit of the thickness. The hard mask film 3 has a film thickness sufficient to be capable of functioning as an etching mask until the end of dry etching for forming a pattern on the light shielding film 2 located immediately under the hard mask film 3, and the thickness of the hard mask film 3 is not basically limited by optical properties. Therefore, the hard mask film 3 can have a thickness significantly smaller than the thickness of the light shielding film 2. Then, since a resist film made of an organic material has a film thickness sufficient to function as an etching mask until the end of dry etching for forming a pattern on this hard mask film 3, the resist film can have the thickness significantly smaller than the thickness of a known resist film, and the problem such as resist pattern collapse can be suppressed.

The hard mask film 3 is preferably formed of a chromium (Cr)-containing material. The chromium-containing material has particularly high dry etching durability to dry etching using fluorine-based gas such as $SF_6$.

When the chromium-containing material is used for the light shielding film 2, the film thickness of the light shielding film 2 is relatively large. Thus, a problem of side etching occurs during dry etching of the light shielding film 2. However, when the chromium-containing material is used for the hard mask film 3, the film thickness of the hard mask film 3 is relatively small. Thus, a problem due to side etching is less likely to occur.

Examples of the chromium-containing material include a chrome metal and a material containing one or more elements incorporated in chromium and selected from oxygen, nitrogen, carbon, boron, and fluorine, such as CrN, CrC, CrON, CrCO, and CrCON. A film made of a material containing these elements added to the chrome metal is likely to be a film with an amorphous structure. Surface roughness of the film and line edge roughness in dry etching of the light shielding film 2 are suppressed. Thus, such a film is preferable.

Additionally, from the viewpoint of dry etching of the hard mask film 3, a material containing one or more elements incorporated in chromium and selected from oxygen, nitrogen, carbon, boron, and fluorine is preferably used as a material forming the hard mask film 3.

A chromium-based material is etched with a mixed gas of chlorine-based gas and oxygen gas. However, a chromium metal has an etching rate relatively low for this etching gas. One or more elements selected from oxygen, nitrogen, carbon, boron, and fluorine can be incorporated in chromium to enhance the etching rate for the etching mixed gas of chlorine-based gas and oxygen gas. Additionally, the chromium-containing material forming the hard mask film 3 may contain one or more elements of indium, molybdenum, or tin. The chromium-containing material forming the hard mask film 3 contains one or more elements of indium, molybdenum, or tin and thus, the etching rate for a mixed gas of chlorine-based gas and oxygen gas can be further enhanced.

As a material forming the hard mask film 3 other than the chromium-containing material, a metal such as tantalum (Ta) and tungsten (W), or a material containing a metal such as tantalum is also applicable. In this case, examples of the material containing tantalum include a tantalum metal, and a material containing one or more elements incorporated in tantalum and selected from nitrogen, boron, and carbon. Specific examples thereof include Ta, TaN, TaO, TaON, TaBN, TaBO, TaBON, TaCN, TaCO, TaCON, TaBCN, and TaBOCN.

In the mask blank 100, a resist film made of an organic material and having a film thickness of 100 nm or less is preferably formed in contact with a surface of the hard mask film 3. In the case of a fine pattern supporting the hp 32 nm generation of DRAMs, a Sub-Resolution Assist Feature (SRAF) having a line width of 40 nm may be provided on a transfer pattern to be formed on the hard mask film 3. However, since even in such a case, an aspect ratio of a cross section of a resist pattern can be as low as 1:2.5, collapsing or peeling off of the resist pattern during development, rinsing, or the like of the resist film can be suppressed. Note that the resist film more preferably has a film thickness of 80 nm or less.

In the mask blank 100, a resist film can also be formed directly in contact with the light shielding film 2 without the hard mask film 3 being provided. In this case, the mask blank 100 includes a simple structure and dry etching of the hard mask film 3 becomes unnecessary when a transfer mask is manufactured. Therefore, the number of steps in manufacturing can be reduced. Note that in this case, the resist film is preferably formed after the light shielding film 2 is subjected to surface treatment using hexamethyldisilazane (HMDS) or the like.

Additionally, the mask blank of the present disclosure is a mask blank suitable for application of a binary mask, as described below. However, the mask blank is not limited to the application of a binary mask. The mask blank can be used as a mask blank for a Levenson phase shift mask or a mask blank for a Chromeless Phase Lithography (CPL) mask.

Transfer Mask

FIGS. 4A to 4F are schematic cross-sectional views illustrating steps in manufacturing the transfer mask (binary mask) 200 from the mask blank 100 according to the embodiment of the present disclosure.

The transfer mask 200 in the embodiment of the present disclosure is a binary mask including the light shielding film 2 having a transfer pattern (light shielding film pattern 2a) on the transparent substrate 1. The light shielding film is a single layer film formed of a material containing silicon and nitrogen, and has an optical density to an ArF excimer laser exposure light of 2.5 or more, a surface reflectance to the exposure light of 40% or less, and a back-surface reflectance to the exposure light of 40% or less, a transmittance to a light having a wavelength of 900 nm of 50% or less, an extinction coefficient to a light having a wavelength of 900 nm of 0.04 or more, and a thickness of 60 nm or less.

Matters relating to the transparent substrate 1 and the light shielding film 2 in the transfer mask 200 are the same as those in the mask blank 100, and the transfer mask 200 has the same technical features as those of the mask blank 100.

Additionally, in a method of manufacturing the transfer mask 200 of the present disclosure, the aforementioned mask blank 100 is used. The method includes the steps of forming a pattern including a transfer pattern and an alignment mark on the hard mask film 3 by dry etching, forming a pattern including a transfer pattern and an alignment mark on the light shielding film 2 by dry etching using the hard mask film 3 having the pattern (hard mask pattern 3a) as a mask, and removing the hard mask pattern 3a.

In such a transfer mask 200, even when an exposure apparatus configured to perform alignment using the long-wavelength detection light LW is used, an alignment mark can be detected with sufficient contrast. Thus, an alignment operation can be executed without causing an error.

In addition, the transfer mask 200 has high ArF light fastness, and even in the case of the transfer mask 200 obtained after cumulative irradiation with exposure light of an ArF excimer laser, a Critical Dimension (CD) change (increase) of the light shielding film pattern 2a can be suppressed to fall within a small range.

Thus, the transfer mask 200 is placed on a mask stage of an exposure apparatus using an ArF excimer laser as exposure light and configured to perform alignment using the long-wavelength detection light LW. Even when the light shielding film pattern 2a is transferred by exposure to a resist film, a pattern can be transferred to the resist film on a semiconductor device with precision sufficiently satisfying design specification in association with a mask alignment operation.

Hereinafter, the method of manufacturing the transfer mask 200 will be described as an example according to the steps in manufacturing illustrated in FIGS. 4A to 4F. Note that in this example, a material containing silicon and nitrogen is applied to the light shielding film 2 and a chromium-containing material is applied to the hard mask film 3.

First, the mask blank 100 (see FIG. 4A) is prepared and a resist film is formed in contact with the hard mask film 3 using a spin coating method. Next, the pattern to be formed on the light shielding film 2 is exposure-drawn and a predetermined treatment such as a development treatment is further performed to form a resist pattern 4a (see FIG. 4B). Note that the pattern written by an electron beam includes a transfer pattern and an alignment mark.

Subsequently, dry etching using chlorine-based gas such as a mixed gas of chlorine and oxygen and using the resist pattern 4a as a mask is performed to form a pattern (hard mask pattern 3a) on the hard mask film 3 (see FIG. 4C). The chlorine-based gas is not particularly limited as long as the chlorine-based gas contains Cl. Examples of the chlorine-based gas can include $Cl_2$, $SiCl_2$, $CHCl_3$, $CH_2Cl_2$, and $BCl_3$. When the mixed gas of chlorine and oxygen is used, a flow rate ratio of the gas may be, for example, $Cl_2:O_2=4:1$.

Figure 4C:
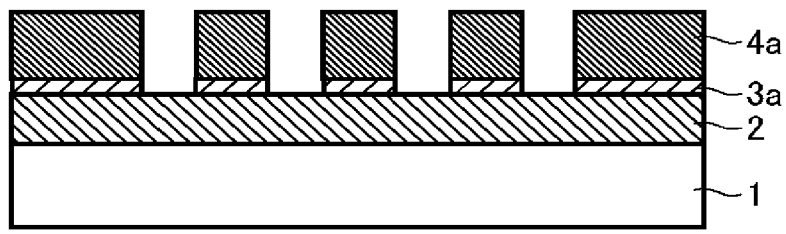
Figure 4D:
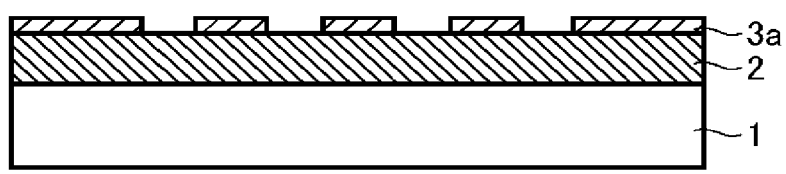

Next, the resist pattern 4a is removed by ashing or using a resist stripper (see FIG. 4D).

Figure 4E:
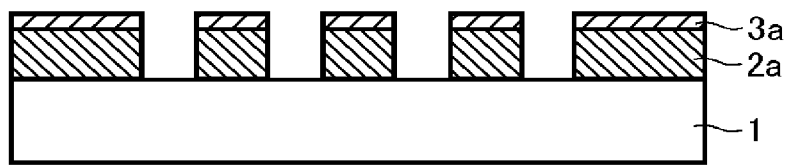

Subsequently, dry etching using fluorine-based gas and using the hard mask pattern 3a as a mask is performed to form a pattern (light shielding film pattern 2a) on the light shielding film 2 (see FIG. 4E). As the fluorine-based gas, any gas containing F can be used, and $SF_6$ is favorable. In addition to $SF_6$, examples of the fluorine-based gas can include $CHF_3$, $CF_4$, $C_2F_6$, and $C_4F_6$. Fluorine-based gas containing C has a relatively high etching rate for the transparent substrate 1 made of a glass material. Since $SF_6$ causes small damage to the transparent substrate 1, $SF_6$ is preferable. Note that He or the like may further be added to $SF_6$.

Thereafter, the hard mask pattern 3a is removed using a chromium etching liquid and a predetermined treatment such as washing is performed to obtain the transfer mask 200

Figure 4F:
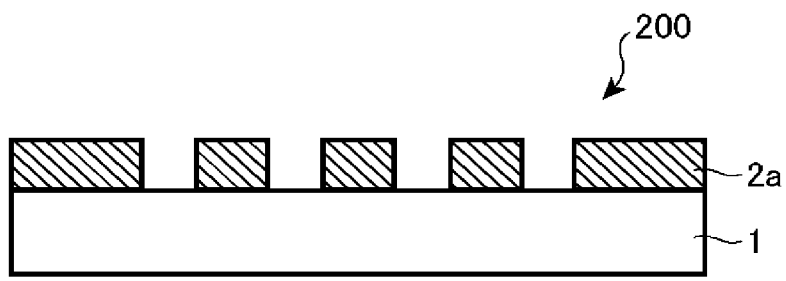

(see FIG. 4F). Note that in the step of removing the hard mask pattern 3a, dry etching using a mixed gas of chlorine and oxygen may be performed. Here, an example of the chromium etching liquid can include a mixture containing diammonium cerium nitrate and perchloric acid.

Note that the case where the transfer mask 200 is a binary mask is described here; however, the transfer mask of the present disclosure is not limited to a binary mask and can be applied to a Levenson phase shift mask or a CPL mask. That is, when the transfer mask is a Levenson phase shift mask, the light shielding film of the present disclosure can be used for a light shielding film of the transfer mask. Additionally, when the transfer mask is a CPL mask, the light shielding film of the present disclosure can be used at a region mainly including an outer circumferential light shielding band. Then, as with the case of the binary mask, in the case of a Levenson phase shift mask and a CPL mask, alignment mark detection can be performed using the long-wavelength detection light LW with sufficient contrast.

Further, a method of manufacturing a semiconductor device of the present disclosure includes transferring by exposure a pattern to a resist film on a semiconductor substrate using the aforementioned transfer mask 200 or the transfer mask 200 manufactured using the aforementioned mask blank 100.

The transfer mask 200 and the mask blank 100 of the present disclosure have the effects as described above. Therefore, when the transfer mask of the present disclosure is used to perform exposure on a resist film formed on a semiconductor wafer, alignment mark detection can be performed with sufficient sensitivity. Therefore, a semiconductor device can be manufactured without an exposure operation stop associated with insufficient alignment mark detection sensitivity and with high ArF light fastness.

EXAMPLES

Hereinafter, embodiments of the present disclosure will be described more specifically by way of examples.

Example 1

Manufacture of Mask Blank

A transparent substrate 1 having a main surface dimension of approximately 152 mm x approximately 152 mm and including synthetic quartz glass having a thickness of approximately 6.25 mm was prepared. An end surface and a main surface of this transparent substrate 1 were polished to obtain predetermined surface roughness and then subjected to predetermined washing treatment and drying treatment.

Next, the transparent substrate 1 was installed in a single-wafer RF sputtering apparatus, and a light shielding film 2 including silicon and nitrogen (Si:N=50 atom %:50 atom %) was formed to have a thickness of 57 nm on the transparent substrate 1 by reactive sputtering (RF sputtering) using a silicon (Si) target and a mixed gas of krypton (Kr), helium (He), and nitrogen ($N_2$) (flow rate ratio Kr:He:$N_2$=10:100:1, pressure: 0.1 Pa) as a sputtering gas at an electric power of a RF power supply of 1.5 kW. Here, the composition of the light shielding film 2 is of a result obtained by measurement by an X-ray photoelectron spectroscopy (XPS). Hereinafter, a method of measuring film compositions of other films is similar to the aforementioned method.

Next, the transparent substrate 1 on which the light shielding film 2 was formed was subjected to heating treatment under conditions of a heating temperature of 500° C. and treatment time of 1 hour in air to adjust a stress of the film. FIG. 2 shows a result obtained using a spectrophotometer (Cary4000 manufactured by Agilent Technologies) to measure a spectral transmission of the light shielding film 2 obtained after the heating treatment. A transmittance to a long-wavelength light having a wavelength of 800 nm or more and 900 nm or less monotonically increases as the wavelength is longer. The transmittances at wavelengths of 800 nm, 850 nm, 890 nm, and 900 nm were 42.8%, 44.9%, 46.7%, and 47.0%, respectively. Additionally, an optical density (OD value) to an ArF excimer laser light (wavelength: 193 nm) was 2.96.

Additionally, a refractive index n and an extinction coefficient k of the light shielding film 2 were measured using a spectroscopic ellipsometer (M-200D available from J. A. Woollam Co., Inc.). FIG. 3 shows spectral properties of the light shielding film 2, that is, measurement results of the refractive index n and the extinction coefficient k at each wavelength. The refractive index n at a wavelength of 193 nm was 1.830 and the extinction coefficient k at a wavelength of 193 nm was 1.785. The refractive index n at a wavelength of 800 nm was 3.172 and the extinction coefficient k at a wavelength of 800 nm was 0.093. The refractive index n at a wavelength of 850 nm was 3.137 and the extinction coefficient k at a wavelength of 850 nm was 0.066. The refractive index n at a wavelength of 890 nm was 3.112 and the extinction coefficient k at a wavelength of 890 nm was 0.050. The refractive index n at a wavelength of 900 nm was 3.106 and the extinction coefficient k at a wavelength of 900 nm was 0.047.

A surface reflectance and a back-surface reflectance of the light shielding film 2 at a wavelength of 193 nm were measured using a spectrophotometer (U-4100 available from Hitachi High-Technologies Corporation), and values of the surface reflectance and the back-surface reflectance were 37.1% and 30.0%, respectively.

Next, the transparent substrate 1 on which the light shielding film 2 obtained after the heating treatment was formed was installed in a single-wafer DC sputtering device, and a hard mask film 3 including a CrN film having a film thickness of 5 nm was formed by reactive sputtering (DC sputtering) using a chromium (Cr) target in an atmosphere of a mixed gas of argon (Ar) and nitrogen ($N_2$). A film composition ratio of this film was measured by XPS, and had Cr of 75 atom % and N of 25 atom %. Then, heat treatment was performed at a temperature (280° C.) lower than the temperature in the heating treatment performed on the light shielding film 2 and a stress of the hard mask film 3 was adjusted.

A mask blank 100 including a structure in which the light shielding film 2 and the hard mask film 3 were layered on the transparent substrate 1 was manufactured by the aforementioned procedure.

Manufacture of Transfer Mask

Next, a transfer mask (binary mask) 200 in Example 1 was produced by the following procedure with use of the mask blank 100 in Example 1.

First, the mask blank 100 in Example 1 (see FIG. 4A) was prepared. A resist film including a chemically amplified resist for electron beam lithography and having a film thickness of 80 nm was formed in contact with a surface of the hard mask film 3. Next, a pattern to be formed on the light shielding film 2 was written by an electron beam on the resist film and predetermined development treatment and washing treatment were performed to form a resist pattern 4a (see FIG. 4B). Note that the pattern written by an electron beam includes a transfer pattern and an alignment mark.

Next, dry etching using a mixed gas of chlorine and oxygen (gas flow rate ratio $Cl_2:O_2=4:1$) was performed using the resist pattern 4a as a mask, to form a pattern (hard mask pattern 3a) on the hard mask film 3 (see FIG. 4C).

Next, the resist pattern 4a was removed (see FIG. 4D). Subsequently, dry etching using fluorine-based gas (mixed gas of $SF_6$ and He) was performed using the hard mask pattern 3a as a mask, to form a pattern (light shielding film pattern 2a) on the light shielding film 2 (see FIG. 4E).

Thereafter, the hard mask pattern 3a was removed using a chromium etching liquid containing diammonium cerium nitrate and perchloric acid and was subjected to predetermined treatment such as washing to obtain the transfer mask 200 (see FIG. 4F).

The transfer mask 200 manufactured in Example 1 was placed in an exposure apparatus using long-wavelength detection light LW, and alignment mark detection was performed. At that time, the mark detection was able to be performed with sufficient contrast. Then, a mask alignment operation was able to be executed without causing any error.

Next, the transfer mask 200 was subjected to intermittent irradiation treatment with an ArF excimer laser beam at a cumulative irradiation amount of 40 $kJ/cm^2$. An amount of change in CD of the light shielding film pattern 2a before and after this irradiation treatment was 1.2 nm or less, and was an amount of change in CD falling within the range usable as the light shielding film pattern 2a. Thus, it was found that the light shielding film pattern 2a has sufficient ArF light fastness in practical terms.

The transfer mask 200 in Example 1 was placed on a mask stage of the exposure apparatus, and exposure-transferred on a resist film on a semiconductor device. As a result, a circuit pattern was able to be formed with high precision without causing mask alignment failure.

Comparison Example 1

Manufacture of Mask Blank

A mask blank in Comparative Example 1 was manufactured by the same procedure as the procedure for the mask blank 100 in Example 1 except that a light shielding film was formed as follows.

The method of forming a light shielding film in Comparative Example 1 is as follows. A transparent substrate 1 was installed in a single-wafer RF sputtering device. A light shielding film including silicon and nitrogen (Si:N=48 atom %:52 atom %) and having a thickness of 100 nm was formed on the transparent substrate 1 by reactive sputtering (RF sputtering) using a silicon (Si) target and using a mixed gas of krypton (Kr), helium (He), and nitrogen ($N_2$) as a sputtering gas.

Next, the transparent substrate 1 on which the light shielding film was formed was subjected to heating treatment under conditions of a heating temperature of 500° C. and treatment time of 1 hour in air to adjust the stress of the film. A spectral transmission of the light shielding film obtained after the heating treatment was measured by a spectrophotometer (Cary4000 available from Agilent Technologies). As a result, the transmittances at wavelengths of 800 nm, 850 nm, 890 nm, and 900 nm were 74.2%, 74.2%, 73.9%, and 73.9%, respectively. Additionally, an optical density (OD value) to an ArF excimer laser beam (wavelength: 193 nm) was 2.9.

Additionally, a refractive index n and an extinction coefficient k of the light shielding film were measured using a spectroscopic ellipsometer (M-200D available from J. A. Woollam Co., Inc.). The refractive index n at a wavelength of 193 nm was 2.4 and the extinction coefficient k at a wavelength of 193 nm was 1.0. The refractive index n at a wavelength of 800 nm was 2.3 and the extinction coefficient k at a wavelength of 800 nm was 0. The refractive index n at a wavelength of 850 nm was 2.3 and the extinction coefficient k at a wavelength of 850 nm was 0. The refractive index n at a wavelength of 890 nm was 2.3 and the extinction coefficient k at a wavelength of 890 nm was 0. The refractive index n at a wavelength of 900 nm was 2.3 and the extinction coefficient k at a wavelength of 900 nm was 0.

A surface reflectance and a back-surface reflectance of the light shielding film at a wavelength of 193 nm were measured using a spectrophotometer (U-4100 available from Hitachi High-Technologies Corporation), and values of the surface reflectance and the back-surface reflectance were 21% and 15%, respectively.

Manufacture of Transfer Mask

Next, a transfer mask (binary mask) in Comparative Example 1 was manufactured by the same procedure as in Example 1 with use of the mask blank in Comparative Example 1.

The manufactured transfer mask in Comparative Example 1 was placed in an exposure apparatus using long-wavelength detection light LW, and alignment mark detection was performed. At that time, the mark detection could not be performed with sufficient contrast. Then, a mask alignment error was often caused.

Next, the transfer mask in Comparative Example 1 was subjected to intermittent irradiation treatment with an ArF excimer laser beam at a cumulative irradiation amount of 40 $kJ/cm^2$. An amount of change in CD of the light shielding film pattern before and after this irradiation treatment was 1.2 nm or less, and was an amount of change in CD falling within the range usable as the light shielding film pattern. The light shielding film pattern had sufficient ArF light fastness in practical terms.

The transfer mask 200 in Comparative Example 1 was placed on a mask stage of the exposure apparatus, and exposure-transferred on a resist film on a semiconductor device. At that time, a mask alignment failure often occurred, and stable exposure for manufacturing a semiconductor device could not be performed.

REFERENCE SIGNS LIST

1 Transparent substrate
2 Light shielding film
2a Light shielding film pattern
3 Hard mask film
3a Hard mask pattern
4a Resist pattern
100 Mask blank
200 Transfer mask (binary mask)

The invention claimed is:
1. A mask blank comprising:
a transparent substrate; and
a light shielding film on the transparent substrate,
wherein the light shielding film includes:
 a lower layer on the transparent substrate; and
 an upper layer on the lower layer,
wherein the lower layer contains silicon and nitrogen,
wherein the upper layer contains silicon and oxygen,
wherein an optical density to an ArF excimer laser exposure light of the light shielding film is 2.5 or more,
wherein a surface reflectance to the exposure light of the light shielding film is 30% or less, wherein a back-surface reflectance to the exposure light of the light shielding film is 40% or less, wherein a transmittance to a light having a wavelength of 900 nm of the light shielding film is 50% or less, wherein an extinction coefficient k to a light having a wavelength of 900 nm of the light shielding film is 0.04 or more, and wherein a thickness of the light shielding film is 60 nm or less.

2. The mask blank according to claim 1, wherein the lower layer is made of a material consisting of silicon and nitrogen, or a material consisting of silicon, nitrogen, and one or more elements selected from a semimetal element and a non-metal element.

3. The mask blank according to claim 1, wherein the upper layer is made of a material consisting of silicon and oxygen, or a material consisting of silicon, oxygen, and one or more elements selected from a semimetal element and a non-metal element.

4. The mask blank according to claim 1, wherein an extinction coefficient k to a light having a wavelength of 700 nm of the lower layer is 0.10 or more.

5. The mask blank according to claim 1, wherein a refractive index n to a light having a wavelength of 900 nm of the lower layer is 3.5 or less.

6. The mask blank according to claim 1, wherein a refractive index n to a light having a wavelength of 700 nm of the lower layer is 3.8 or less.

7. The mask blank according to claim 1, a refractive index n to the exposure light of the lower layer is 1.6 or more and 2.1 or less.

8. The mask blank according to claim 1, an extinction coefficient k to the exposure light of the lower layer is 1.6 or more and 2.1 or less.

9. The mask blank according to claim 1, wherein a hard mask film made of a material containing chromium is formed on the light shielding film.

10. A transfer mask comprising:
a transparent substrate; and
a light shielding film having a transfer pattern on the transparent substrate,
wherein the light shielding film includes:
a lower layer on the transparent substrate; and
an upper layer on the lower layer,
wherein the lower layer contains silicon and nitrogen,
wherein the upper layer contains silicon and oxygen, wherein an optical density to an ArF excimer laser exposure light of the light shielding film is 2.5 or more, wherein a surface reflectance to the exposure light of the light shielding film is 30% or less, wherein a back-surface reflectance to the exposure light of the light shielding film is 40% or less, wherein a transmittance to a light having a wavelength of 900 nm of the light shielding film is 50% or less, wherein an extinction coefficient k to a light having a wavelength of 900 nm of the light shielding film is 0.04 or more, and wherein a thickness of the light shielding film is 60 nm or less.

11. The transfer mask according to claim 10, wherein the lower layer is made of a material consisting of silicon and nitrogen, or a material consisting of silicon, nitrogen, and one or more elements selected from a semimetal element and a non-metal element.

12. The transfer mask according to claim 10, wherein the upper layer is made of a material consisting of silicon and oxygen, or a material consisting of silicon, oxygen, and one or more elements selected from a semimetal element and a non-metal element.

13. The transfer mask according to claim 10, wherein an extinction coefficient k to a light having a wavelength of 700 nm of the lower layer is 0.10 or more.

14. The transfer mask according to claim 10, wherein a refractive index n to a light having a wavelength of 900 nm of the lower layer is 3.5 or less.

15. The transfer mask according to claim 10, wherein a refractive index n to a light having a wavelength of 700 nm of the lower layer is 3.8 or less.

16. The transfer mask according to claim 10, a refractive index n to the exposure light of the lower layer is 1.6 or more and 2.1 or less.

17. The transfer mask according to claim 10, an extinction coefficient k to the exposure light of the lower layer is 1.6 or more and 2.1 or less.

18. A method of manufacturing a semiconductor device, the method comprising the step of exposure-transferring a transfer pattern on a resist film on a semiconductor substrate using the transfer mask according to claim 10.

* * * * *